United States Patent
Hornberg et al.

(10) Patent No.: US 7,087,443 B2
(45) Date of Patent: Aug. 8, 2006

(54) OPTIMIZED TEMPERATURE CONTROLLER FOR COLD MASS INTRODUCTION

(75) Inventors: Christopher R. Hornberg, Phoenix, AZ (US); Kevin D. Stoddard, Phoenix, AZ (US)

(73) Assignee: Brooks Automation, Inc., Chelmsford, MA (US)

( * ) Notice: Subject to any disclaimer, the term of this patent is extended or adjusted under 35 U.S.C. 154(b) by 55 days.

(21) Appl. No.: 10/628,981

(22) Filed: Jul. 29, 2003

(65) Prior Publication Data

US 2005/0026460 A1    Feb. 3, 2005

(51) Int. Cl.
*H01L 21/66* (2006.01)
*H05B 1/02* (2006.01)
*G01R 31/26* (2006.01)

(52) U.S. Cl. .................. 438/17; 219/497; 219/483
(58) Field of Classification Search .............. 438/14, 438/795; 219/497, 483
See application file for complete search history.

(56) References Cited

U.S. PATENT DOCUMENTS

| 5,895,596 A | 4/1999 | Stoddard et al. ............. 219/497 |
| 6,207,937 B1 * | 3/2001 | Stoddard et al. ............. 219/497 |
| 6,211,495 B1 | 4/2001 | Stoddard et al. ............. 219/497 |
| 6,441,350 B1 | 8/2002 | Stoddard et al. ............. 219/497 |

OTHER PUBLICATIONS

1) Numerical Heat Transfer Simulations of A Vertical Batch Furnace Under Closed-Loop Temperature Control; Semitool, Inc.; Apr. 5, 1997; pp. 110-117.
2) Improving Furnaces With Model-Based Temperature Control; Solid State Technology; Nov. 1996; pp. 119, 120, 122, 126, 128 and 131.

* cited by examiner

*Primary Examiner*—Alexander Ghyka
(74) *Attorney, Agent, or Firm*—Perman & Green, LLP.; Richard Pickreign

(57) ABSTRACT

A system for minimizing thermal reactor temperature overshoot and stabilization during a boat push. In one embodiment, the setpoint temperatures are reduced to a minimum value. As the temperature in the thermal reactor begins to increase, the setpoint temperatures are ramped back to the original setpoint temperature.

17 Claims, 11 Drawing Sheets

An Example of Independent Ramping

US 7,087,443 B2

OPTIMIZED TEMPERATURE CONTROLLER FOR COLD MASS INTRODUCTION

BACKGROUND OF THE INVENTION

1. Field of the Invention

The present invention is generally related to temperature control during semiconductor processing, and in particular to controlling thermal reactor temperature overshoot during introduction of cold material (wafers) into a semiconductor processing chamber.

2. Brief Description of Related Developments

In contemporary semiconductor manufacturing, standard CVD/Diffusion wafer processing is engineered around constant temperature operations. The reactors or furnaces where such operations take place are equipped with temperature sensors (thermocouples). Two sets of such sensors are generally used. Spike thermocouples, located next to the heating element and profile thermocouples, located inside the process tube, are in turn, used by the reactor control system to achieve and maintain the desired processing temperature of the wafers. Modern control systems technology has resulted in significant improvements of the reactor temperature response, in terms of set point tracking accuracy and precision, uniformity (zone matching), and disturbance attenuation. However, the one aspect of control that has remained elusive has been temperature control during the introduction of cold material (wafers) into the processing chamber, often referred to as a "boat push". There is a problematic temperature response caused by the large disturbance that a boat push has on the temperature control. Controllers tend to have problems with large overshoots for boat pushes due to the large period of time the controller is saturated trying to recover from the cold wafers passing by the profile thermocouples. Thus, it is necessary to reduce the saturation and recover from the boat push in a controlled manner. It would be helpful to reduce the thermal reactor temperature overshoot that typically occurs following the introduction of cold wafers.

SUMMARY OF THE INVENTION

The present invention is directed to minimizing thermal reactor temperature overshoot and stabilization during a boat push. In one embodiment, the setpoint temperatures are reduced to a minimum value. As the temperature in the thermal reactor begins to increase, the setpoint temperatures are ramped back to the original setpoint temperature.

In another aspect the present invention is directed to a method for controlling temperature overshoot during a boat push in a thermal reactor. In one embodiment the method comprises activating a boat push control mode, waiting a predetermined period of time, reducing current setpoints for each zone, monitoring each zone of the thermal reactor to determine a minimum temperature for each zone, ramping the reduced current setpoints back to an original setpoint.

In a further aspect the present invention is directed to a system for minimizing temperature overshoot in a reactor for heating and cooling a load of wafers to a desired processing temperature during introduction of a material into the reactor. In one embodiment the system comprises a boat push controller adapted to receive setpoint information from a user and provide an optimized setpoint trajectory for temperature control in the reactor. A profile controller is adapted to receive the optimized setpoint trajectory from the boat push controller and determine a temperature setpoint based upon a difference between the desired and observed temperature of a profile thermocouple in the reactor. A spike controller is adapted to receive the temperature setpoint from the profile controller and to apply power to a heating element of the reactor based upon difference between the desired and observed temperature of a spike thermocouple in the reactor.

In yet a further aspect the present invention is directed to a control system for controlling temperature overshoot in a thermal reactor. In one embodiment the system comprises a process sequencing system adapted to accept and execute a process sequence entered by a user. The process sequence can include temperature setpoint values. The system can also include a temperature system for temperature control in accordance with the process sequence, and is adapted to receive temperature control parameters including the setpoints entered by the user. The temperature system is further adapted to, reduce a current temperature setpoint to a minimum value to reduce heat buildup in the reactor during an idle mode and ramp the reactor temperature from the minimum value to an original setpoint value after a predetermined period.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT(S)

Figure 1:
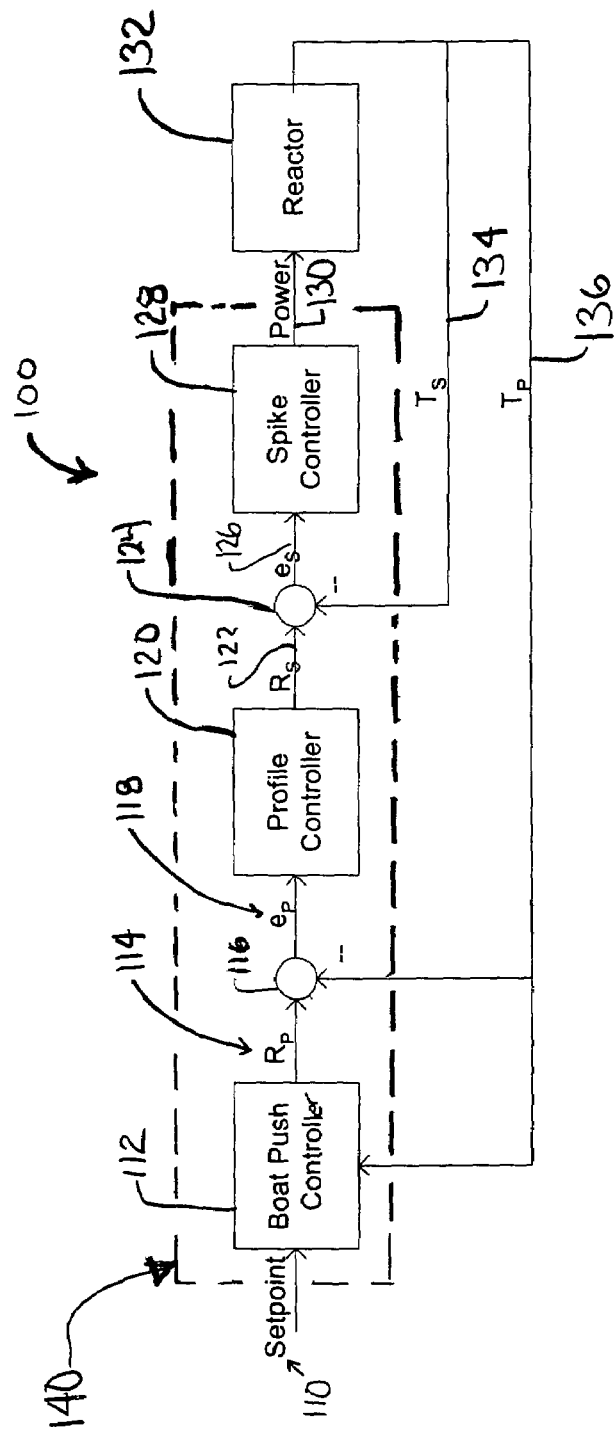
FIG. 1 is a block diagram of one embodiment of a temperature control system for a thermal reactor incorporating features of the present invention.

Referring to FIG. 1, a block diagram of a temperature control system 100 incorporating features of the present invention is illustrated. Although the present invention will be described with reference to the embodiment shown in the drawings, it should be understood that the present invention can be embodied in many alternate forms of embodiments. In addition, any suitable size, shape or type of elements or materials could be used.

As shown in FIG. 1, the system 100 generally comprises a temperature controller 140 coupled to a reactor 132. The temperature controller 140 is generally adapted to control the output of power to the reactor 132 to reduce saturation and temperature over shoot during a boat push. In one embodiment, the temperature controller 140 shown in FIG. 1 comprises a boat push controller 112, a profile controller 120, and a spike controller 128. In alternate embodiments, the system 100 can include any suitable components and systems for controlling and reducing thermal reactor temperature overshoot that can occur during the introduction of cold wafers into a processing chamber of a semiconductor processing reactor. This introduction of cold wafers is referred to herein as a "boat push". It is a feature of the present invention to minimize, and in some instances eliminate, problematic overshoots during a boat push. The present invention generally involves reducing setpoints at the beginning of a boat push. Then, as the temperatures begin to increase, the setpoints are ramped back to the original setpoint.

In one embodiment the boat push controller 112 is adapted to receive setpoint information from a user and provide an optimized setpoint trajectory for temperature control in the reactor. The profile controller 120 is adapted to receive the optimized setpoint trajectory from the boat push controller and determine a temperature setpoint based upon a difference between the desired and observed temperature of a profile thermocouple in the reactor. The spike controller 128 is adapted to receive the temperature setpoint from the profile controller and to apply power to a heating element of the reactor based upon difference between the desired and observed temperature of a spike thermocouple in the reactor. This minimizes temperature overshoot in the reactor for heating and cooling of a load of wafers during introduction of material into the reactor.

Referring to FIG. 1, the boat push controller 112 takes the current profile temperatures (Tp) 136 and setpoints 110 and modifies the profile temperature setpoints (Rp) 114 in order to reduce the setpoints in an attempt to reduce the saturation during the boat push. The current profile temperature (Tp) 136 is subtracted from the profile temperature setpoints (Rp) 114 to get the profile temperature error (Ep) 118. The profile controller 120 uses the error to calculate the spike temperature setpoint (Rs) 122. The spike temperature (Ts) 134 is subtracted from the spike temperature setpoint (Rs) 122 to generate the spike temperature error (Es) 126. The spike controller 128 uses the spike temperature error (Es) 126 to calculate the power 130 to be applied to the reactor 132. The reactor 132 is the physical reactor that is being controlled by the temperature controller 140. The controller 140 (spike controller 128, profile controller 120, and boat push controller 112) sets the percent power that the element will deliver to the reactor. The spike temperatures (Ts) 134 and profile temperatures (Tp) 136 are then measured as the reactor element heats.

Figure 2:
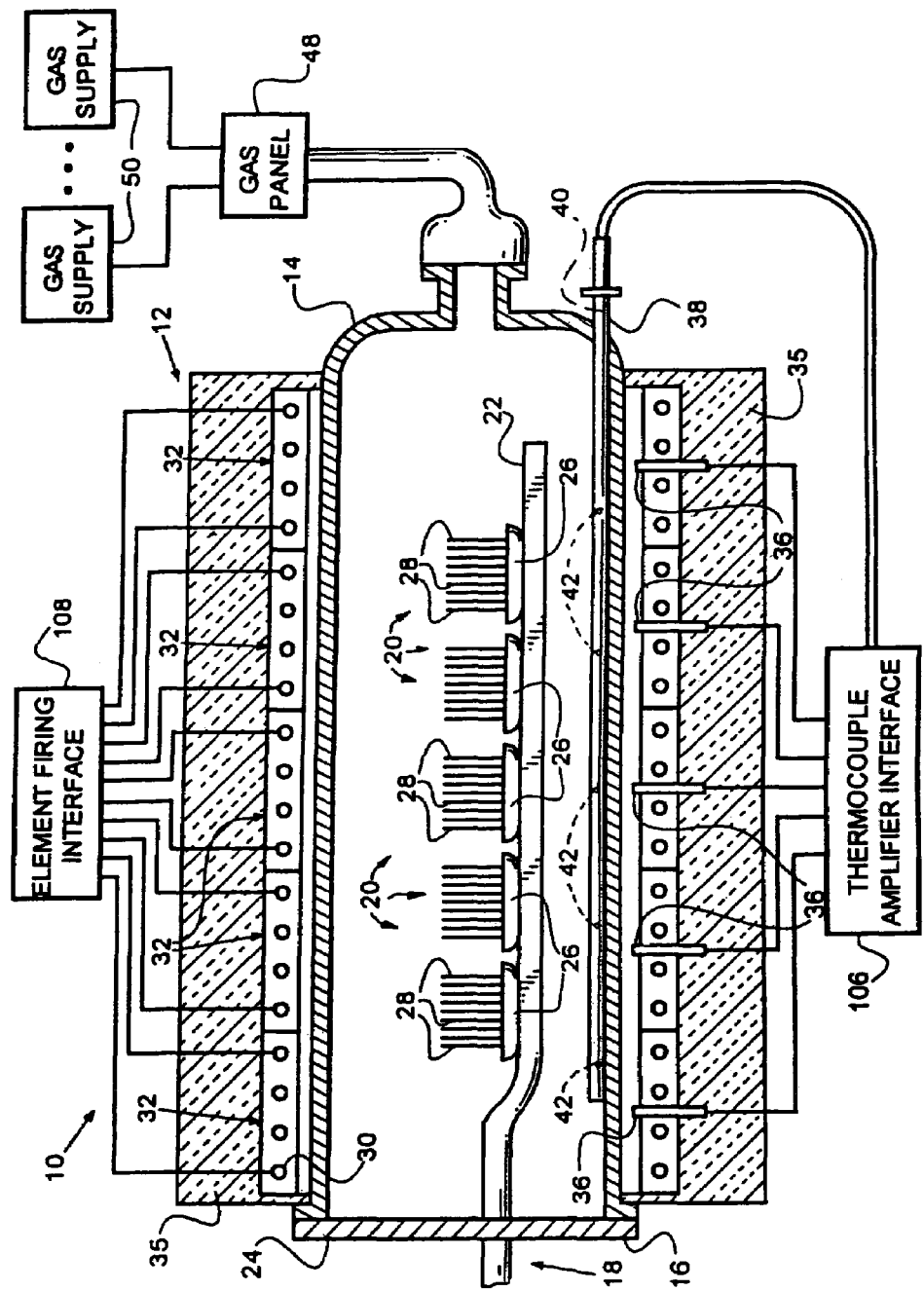
FIG. 2 is a side elevational view, partially in section, of a thermal reactor system that may be controlled using the temperature control system incorporating features of the present invention.

Referring to FIG. 2, during a boat push the cold mass of the wafer load 20 is placed onto the boat 26. This is carried out by any conventional process in a thermal reactor system 10. The reactor 132 of FIG. 1 maintains its idle temperature during the time the boat 26 is pushed back into the reactor. The cold mass of the wafers 28 first passes by, for example, a first load zone 32. This zone 32 then begins to cool, as its mass has just increased greatly, as well as the introduction of a cold mass to the system. This causes the power required for temperature control to increase in these first load zones, usually to saturation (the control is struggling to regain control of this zone). As the boat 26 continues to push in through the first load zones 32, the boat is compressing the heat that has built up during the idle phase as well as the extra heat that is being created due to the increase in power in the first few zones. This causes a temperature rise in the source zones. This causes the power to the source zone to decrease. Again saturating, but this time it saturates low.

From this process of pushing a boat in, there is a large amount of time that all zones 32 of FIG. 2 being measured by the profile controller 120 of FIG. 1 are saturated. When a zone is saturated (or even near saturated), this means that the "Control" is not there. Hence, there is a large amount of time when "Control" is struggling to regain control of the reactor 132.

The boat push control mode of the present invention is adapted to control and reduce this saturation. Traditionally it has been the practice to treat the boat push as a disturbance. It is true the boat push is a disturbance to the traditional Control System. But through previous knowledge of the physics of the boat push it is possible to reduce the saturation of the profile controller 120 and then increasing the "Control" of the system 100.

The profile temperature setpoints (Rp) 114 is then ramped back to the original setpoint from the reduced value by the boat push controller 112. Thus, the boat push controller 112 brings the zones 32 back to the original setpoint at a reasonable ramp rate that can be "controlled".

FIG. 2 illustrates one embodiment of a thermal reactor system 10 that may be controlled using the temperature control system of the present invention. The thermal reactor system 10 includes a thermal reactor 12. Although the reactor of FIG. 2 is shown in a horizontal orientation, it will be understood by those of skill in the art that the thermal reactor 12 can be in any suitable orientation, such as horizontally or vertically.

The thermal reactor 12 includes a process tube 14 defining a reactor chamber. The process tube 14 is preferably made of quartz, silicon carbide or other suitable material. However, any suitable material can be used. In the illustrated embodiment, the process tube is in the general shape of a hollow cylinder having an open end 16 and has a length that extends along and substantially defines a longitudinal axis. The thermal reactor system 10 further includes a boat loader or paddle 18 which inserts or removes a wafer load 20 into or from the process tube 14. More particularly, the boat loader 18 includes a support portion 22, and a door portion 24 which is movable with the support portion and which closes the open end of the process tube 14 when the support portion 22 is inserted into the process tube. The door portion 24 seals and insulates the process tube to prevent heat loss after the wafer load 20 has been inserted into the chamber of the process tube 14.

The wafer load 20 preferably includes one or more boats 26 that, for example, are formed of for example, quartz or silicon carbide. The wafer load 20 further includes a plurality of silicon wafers 28, and each boat 26 supports a plurality of the wafers 28. In the illustrated embodiment, wafers on each boat 26 are equally spaced and the boats 26 of wafers 28 generally form a wafer, or other semiconductor workpiece, processing array.

The thermal reactor 12 also includes one or more heating elements 30 that surround the process tube 14. In the illustrated embodiment, each heating element 30 can comprise an electrical resistance heating coil or coils extending along the length of the processing chamber parallel to the length of the process tube 14. Each heating element 30 is preferably subdivided into a plurality of separately controllable heating zones 32 by, for example, providing connections along the coil to divide the coil or coils into separately controllable zones. The zones are then separately controllable by supplying power to opposite ends of each zone associated coil or portion of a larger coil. More particularly the thermal reactor system 10 can include high current voltage transformers and silicon controlled rectifiers (SCRs) (not shown) 34 for controllably applying power to each of the heating zones 32.

Ceramic insulation 35 encases each heating element 30. The insulation serves to reflect and otherwise direct heat toward the wafer array and, further, serves to provide a more uniform layer to minimize heat flux variations away from the processing array.

Temperature feedback and/or inputs for use in controlling the processing temperatures are derived from at least two sources: a plurality of spike thermocouples 36 and a plurality of profile thermocouples 42. "Thermocouples", as the term is used herein, encompasses a variety of temperature sensors, including the more specific meaning of thermocouples. Alternative temperature sensor constructions are also intended by the use of the term thermocouples. The spike thermocouples 36 can be used to provide the spike temperature (Ts) 134 and the profile thermocouples 42 can be used to provide the profile temperatures (Tp) 136 shown in FIG. 1.

As shown in FIG. 2 the spike thermocouples 36 are placed at a suitable location, such as between the heating element 30 and the process tube 14, to measure the temperature of the heating element at a respective zone. The spike thermocouples 36 are thus spaced apart along the length of the heating element 30, at least one spike thermocouple 36 being located in each of the heating zones 32. The spike thermocouples 36 provide the most specific and responsive indications of the temperature at one of the heating elements in each of the heating zones.

The profile thermocouples 42 are disposed along an elongated profile rod 40 and are supported in a sheath 38 that extends inside the process tube 14. The sheath 38 is preferably formed of quartz or silicon carbide, although any suitable material may be used. The profile rod 40 has a length parallel to the length of the process tube 14. At least one thermocouple 42 is located in each of the heating zones 32. The profile thermocouples 42, however, are not necessarily aligned with the spike thermocouples 36. The profile thermocouples 42 measure temperature inside the process tube 14 and provide an indication of the temperature of the wafer load 20 in each of the respective heating zones.

Figure 4:
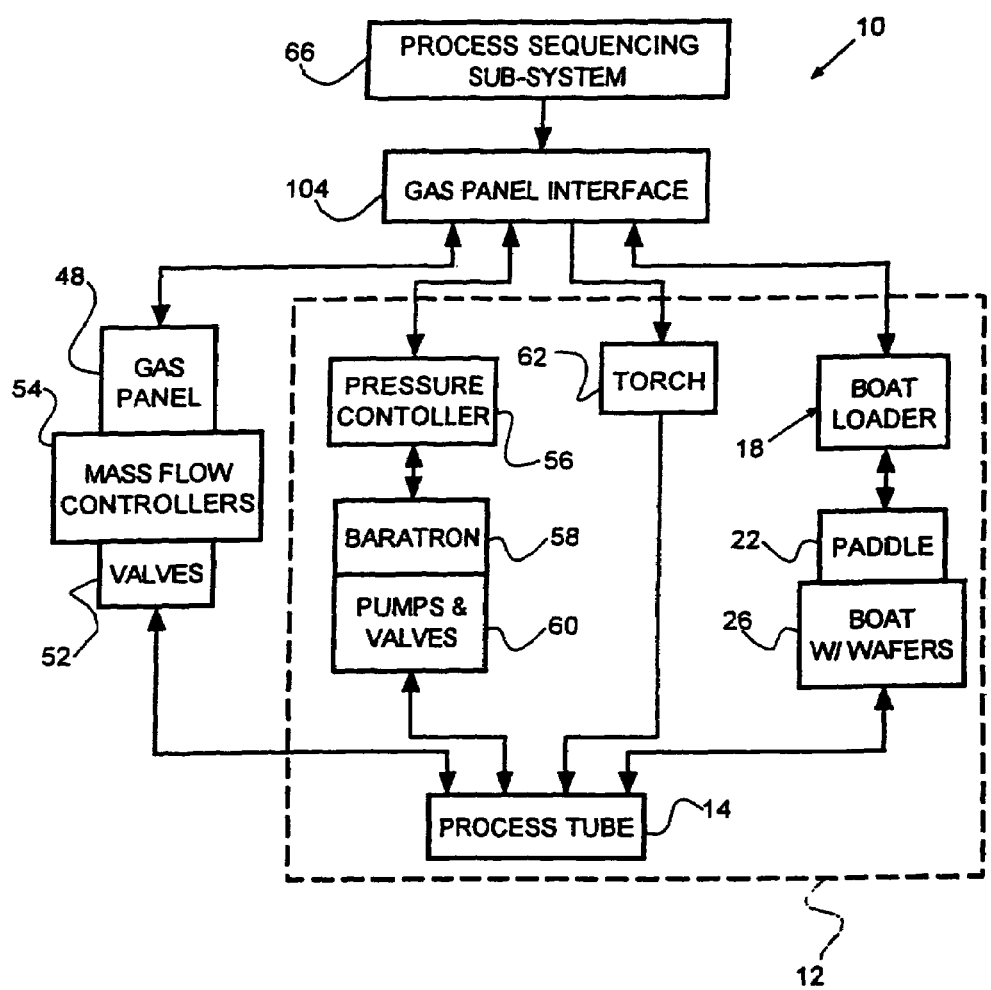
FIG. 4 is a schematic block diagram illustrating one embodiment of a process sequencing system and gas interface that may be used in conjunction with the control system of FIG. 3.

The basic structure of the thermal reactor system 10 of FIG. 2 may be enhanced to expand its applicability to a wide range of microelectronic circuit manufacturing processes. For example, the thermal reactor system 10 may include a gas delivery system or gas panel 48 for controllably injecting process gases from selectable gas supplies 50 into the process tube 14 to grow, diffuse, or deposit material on the surface of the silicon wafers 28. The gas panel 48, as shown in FIG. 4, includes valves 52 and mass flow controllers 54. The mass flow controllers 52 are used to measure and control flows of process gasses into the process tube 14. The thermal reactor 12 may further include a torch 62 internal or external to the process tube 14. The torch 62 is used for wet oxidation processes by burning a ratio of hydrogen and oxygen to produce steam in the process tube 14.

In accordance with another enhancement, the process tube 14 of FIG. 2 may be pressurized for low pressure chemical vapor deposition (LPCVD) processes. As shown in FIG. 4 such a thermal reactor system 10 preferably includes a pressure controller 56 and a baratron or other suitable pressure sensing device 58 which measures the pressure in the process tube and communicates the measured pressure to the pressure controller 56. Further, in these embodiments, the thermal reactor system 10 may include pumps and valves 60, in communication with the pressure controller 56, that are used to achieve the desired pressure in the process tube 14 for the LPCVD process.

Figure 3:
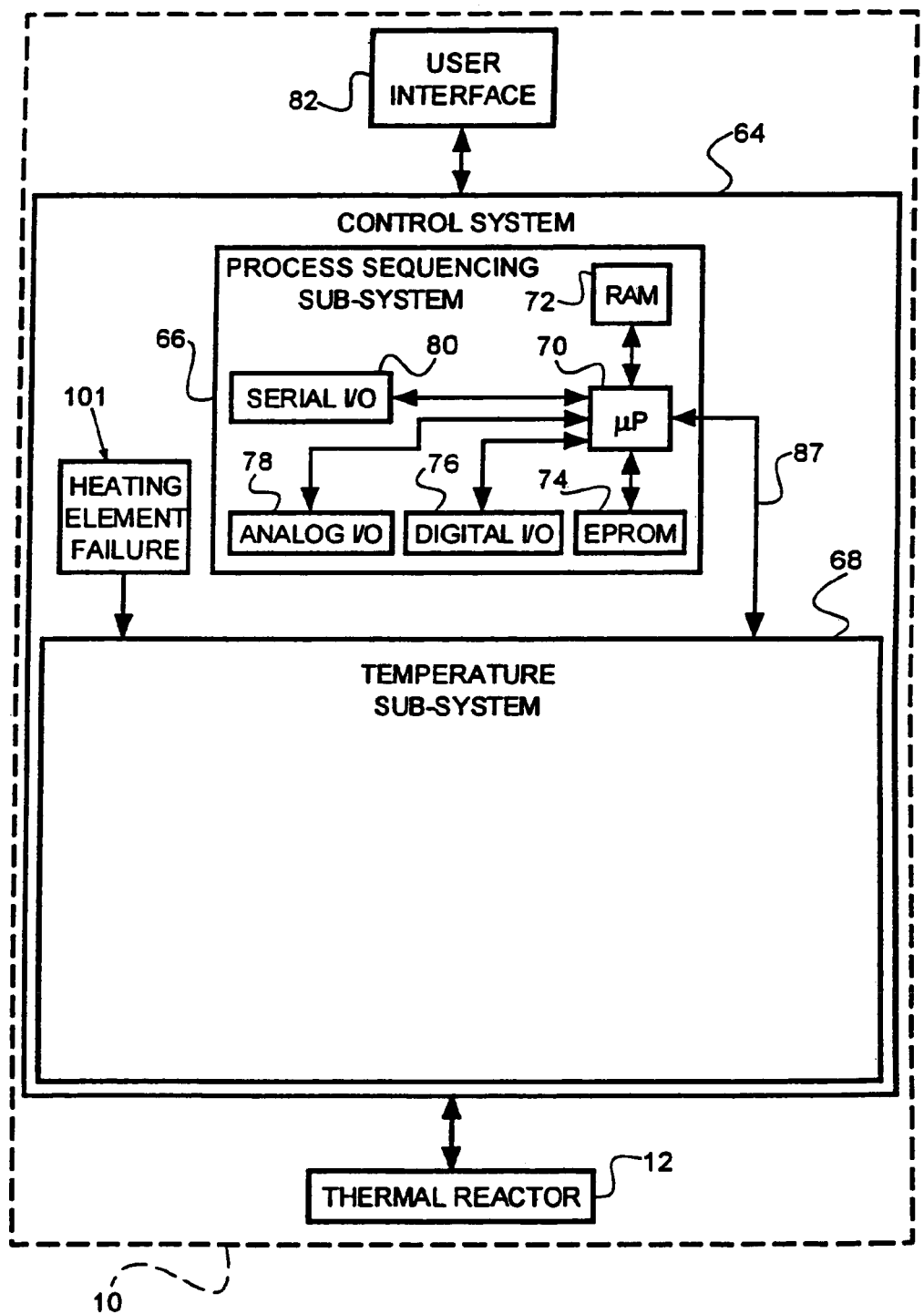
FIG. 3 is a is a block diagram illustrating one embodiment of an architecture for a semiconductor processing control system that includes the temperature control system of the present invention.

In one embodiment, control of the operation of the systems described with reference to FIGS. 1 and 2 can be achieved by interfacing the hardware with a programmable control system that is suitable for entering and executing a user programmed recipe. With reference to FIG. 3, the thermal reactor system 10 includes a control system 64 for controlling the temperature and other processes in the thermal reactor 12. The control system 64 is preferably divided into two subsystems: a process sequencing subsystem 66 for accepting and executing a process sequence, and a temperature subsystem 68 for temperature control in accordance with the process sequencer. Both the process sequencing subsystem 66 and temperature control subsystem 68 follow user defined process recipes that, for example, are entered through user interface 82.

In the illustrated embodiments such as that of FIG. 3, the process sequencing subsystem includes a microprocessor that interfaces with random access memory 72, a programmable EPROM 74 that stores controller logic, a plurality of digital input and output channels 76, a plurality of analog input and output channels 78, and a user interface 82. A plurality of serial input and output channels 80 for external (remote) communication may be included, if external communication is desired. While other user interfaces can be employed, the user interface 82 of the disclosed embodiment comprises a touch screen terminal interface with which a user can enter a user defined process recipe. In the process recipe, the user can define, on a per step basis, step time, gas flows, chamber pressure, temperature setpoints, and ramp rates. Parameters necessary for temperature control are communicated to the temperature control subsystem 68 as input parameters that are used by the temperature control subsystem to implement the temperature control aspects of the recipe. This communication capability is illustrated by line 87. In the disclosed embodiment, such parameters comprise at least the temperature setpoints entered by the user for the recipe.

As noted above, the thermal reactor system 10 may include enhancements, such as a gas delivery system and/or pressure control system, that may be used for film deposition. Such a system may include the control system interface illustrated in FIG. 4 that provides an interface between the process sequencing subsystem 66 and the hardware of the gas delivery system and/or pressure control system. As shown in FIG. 4, a gas panel interface 104 is connected between the gas panel 48 and the process sequencing subsystem 68. The gas panel interface 104 provides the control system 64 with an interface to communicate with the mass flow controllers 54, the gas valves 52, the internal or external torch 62, the pressure controller 56, the boat loader 18, etc. Further, the gas panel interface 104 may include a plurality of hardware safety interlocks for the thermal reactor (e.g., to ensure hydrogen flow with a proper oxygen to hydrogen ratio, to detect a flame from the torch 62, etc.).

The temperature control system 68 of FIG. 3 controls the temperature within the thermal reactor 12 in accordance with a user programmed recipe. Temperature control is preferably based on dynamic modeling of the thermal reactor 12 in which desired temperature states are modeled based on measurable system parameters. In operation, the recipe comprises temperature set-point values that are used by one or more dynamic models to drive the thermal reactor 12 to the desired temperature state.

Figure 5:
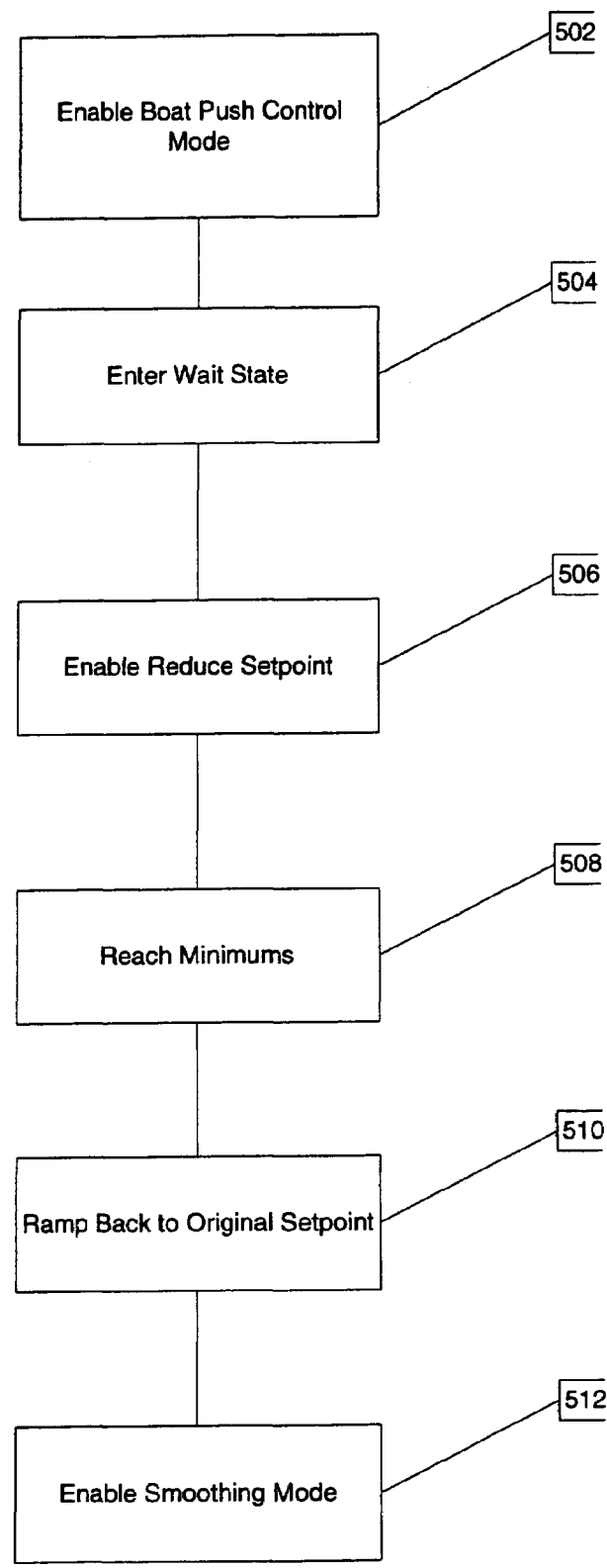
FIG. 5 is a flow chart illustrating one embodiment of a method incorporating features of the present invention.

In one embodiment, referring to FIG. 5, a boat push control mode incorporating features of the present invention generally comprises reducing the current setpoints to a minimum value to begin to reduce some of the heat that has built up in the reactor during idle. "Idle" is generally defined as a period when the tool is not processing. This reduction of the current setpoint helps to reduce the overshoot in the source zones. The reactor is then ramped back to setpoint from the minimum. This reduces the amount of time the load and middle zones are in saturation and bring the zones back into the original setpoint at a reasonable ramp rate that can be "Controlled". The boat push control mode of the present invention can be especially useful for recipes that have identical push and process temperatures.

As shown in FIG. 5, the Boat Push Control mode is enabled 502. This can include the enabling of a flag to signal the start of the boat push. A wait state or "Do Nothing" period is entered or enabled 504. At the end of the wait state, a start flag is generated and reduce setpoint mode is enabled 506. This begins the reduction of the current setpoints to some minimum value 508 as herein defined. Once the minimum is found, depending upon the type of ramping selected, the ramp generator ramps 510 the temperature back to the original setpoint. In one embodiment, as shown in FIG. 5, a smoothing model can be enabled 512 as the temperature ramps toward the original setpoint.

For example, generally, once the enable flag has been set, the boat push control mode begins watching each of the zones finding the minimum. It also begins a timer to know when to begin the sequence of events. Once the timer is greater than the Do Nothing Time the Boat Push Control Mode will do two things. It will reduce the setpoints and it will begin looking for the minimum temperature in each of the zones. The next step depends on which ramping mode has been selected. But after the minimum has been found the setpoint is ramped back up to the Original setpoint. The difference lies in when the ramping begins and where each zone begins ramping from. For Independent ramping, each zone ramps after it finds its own minimum. For OR ramping, all of the zones ramp the moment any minimum has been found. For AND ramping, all of the zones ramp after all the zones have found their minimum. And for Single Reference ramping, the zones wait until all zones have found their minimum and then all zones ramp from the minimum of all the temperatures.

The current setpoint is developed as follows:

N=number of samples since the Boat Push mode was triggered. (note: the sampling period of this control system is 2 Hz; therefore there will be 2 samples every second).

N'=number of samples since minimum was found

N"=number of samples since smoothing began

DNT=(parameter #3) Do Nothing Time.

CS=Current Setpoint

OS=Original Setpoint

R=(parameter #4) Reduce Setpoints by this much

MIN=Minimum temperature

PMW=(parameter #1) Post Minimum wait

RampRate=(parameter #2) The rate of the ramp in deg/min

DBS=(parameter #6) Degrees below setpoint to begin smoothing.

Offset=(parameter #9) the temperature offset above setpoint.

Pole=(parameter #7) this tells how fast the system will move to the offset.

ST=(parameter #8) Smooth Time

Then:

1) $CS = OS$ if $\frac{N}{2} < DNT$

2) $CS = OS - R$ if $\frac{N}{2} \geq DNT$

3) $CS = MIN + \frac{RampRate}{120} * N'$ if $\frac{N}{2} \geq DNT$ and $\frac{N'}{2} \geq PMW$ and $CS < OS - DBS$ 4) $CS = \frac{[OS + Offset] * Pole}{2} + \frac{[1 - Pole] * CS_{Prev}}{2}$ if $\frac{N}{2} \geq DNT$ and $\frac{N'}{2} \geq PMW$ and $CS > OS - DBS$ and $\frac{N''}{2} < ST$ 5) $CS = OS$ if $\frac{N''}{2} > ST$ This gets the basic structure of the system. The remaining differences are in how the minimum is found, which minimum each zone ramps from, and when each zone begins ramping.

Independent Ramping:

Each zone finds its own minimum and then proceeds to ramp from its own minimum immediately after finding its minimum.

OR Ramping:

Each zone finds its own minimum, but all zones begin ramping immediately (even if they have not found their absolute minimum) after any minimum has been found.

AND Ramping:

Each zone finds its own minimum, but they do not begin ramping until all zones have found their minimum.

Single Reference Ramping:

A global minimum is found. From that global minimum all zones ramp together. This mode requires a large PMW to avoid ramping too early; due to the increased variability in finding a global minimum.

Figure 6:
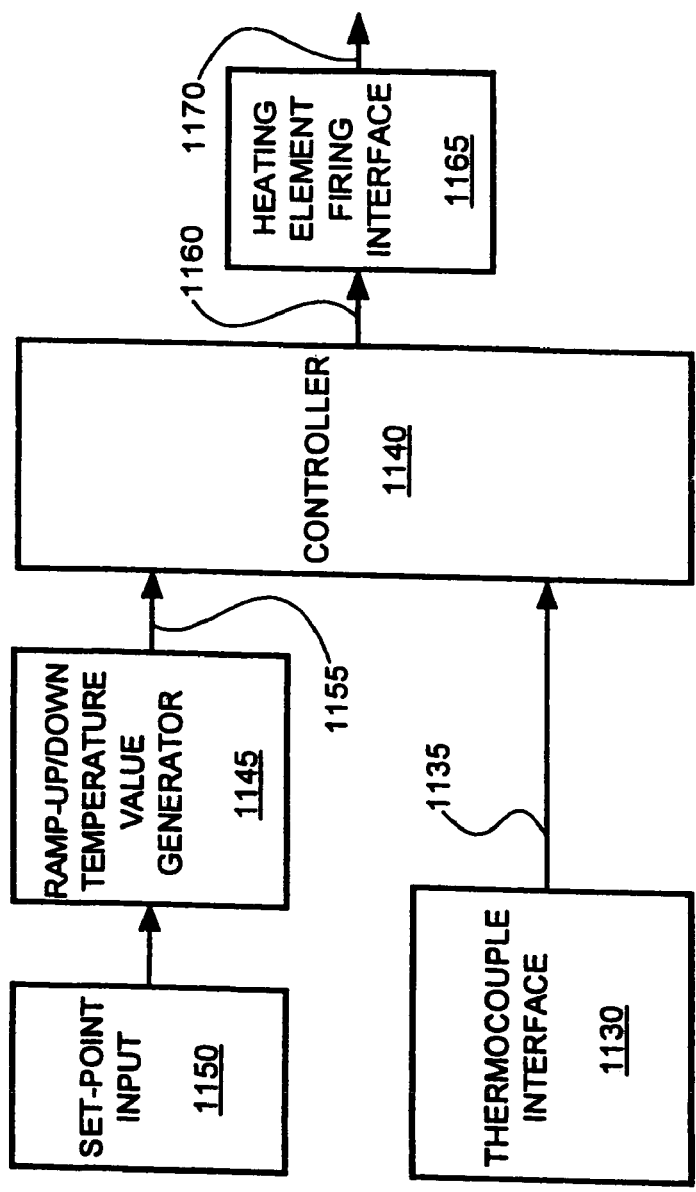
FIG. 6 is a block diagram of one embodiment of a temperature control system incorporating features of the present invention including a ramp temperature value generator.

FIG. 6 illustrates one manner of implementing the temperature control system 68 of FIG. 3 with enhanced ramp trajectory logic. As shown, a controller 1140 is connected to receive a plurality of data values represented by line 1135 that correspond to the temperature values as measured by the thermocouples 36, 42. Additionally, the controller 1140 receives temperature output values 1155, $T_{output}$, from a ramp-up/ramp-down temperature value generator 1145. As will be explained in further detail below, the temperature value generator 1145 provides the temperature output values 1155, $T_{output}$, to the controller 1140 in response to at least the temperature set-point input value, shown logically at 1150, that, for example, is entered by the user as part of the process recipe. It is the logical operations performed by the ramp-up/ramp-down temperature value generator 1145 to generate the temperature output values 1155, $T_{output}$, that assist in preventing temperature overshoot in the thermal reactor 12.

Figure 7:
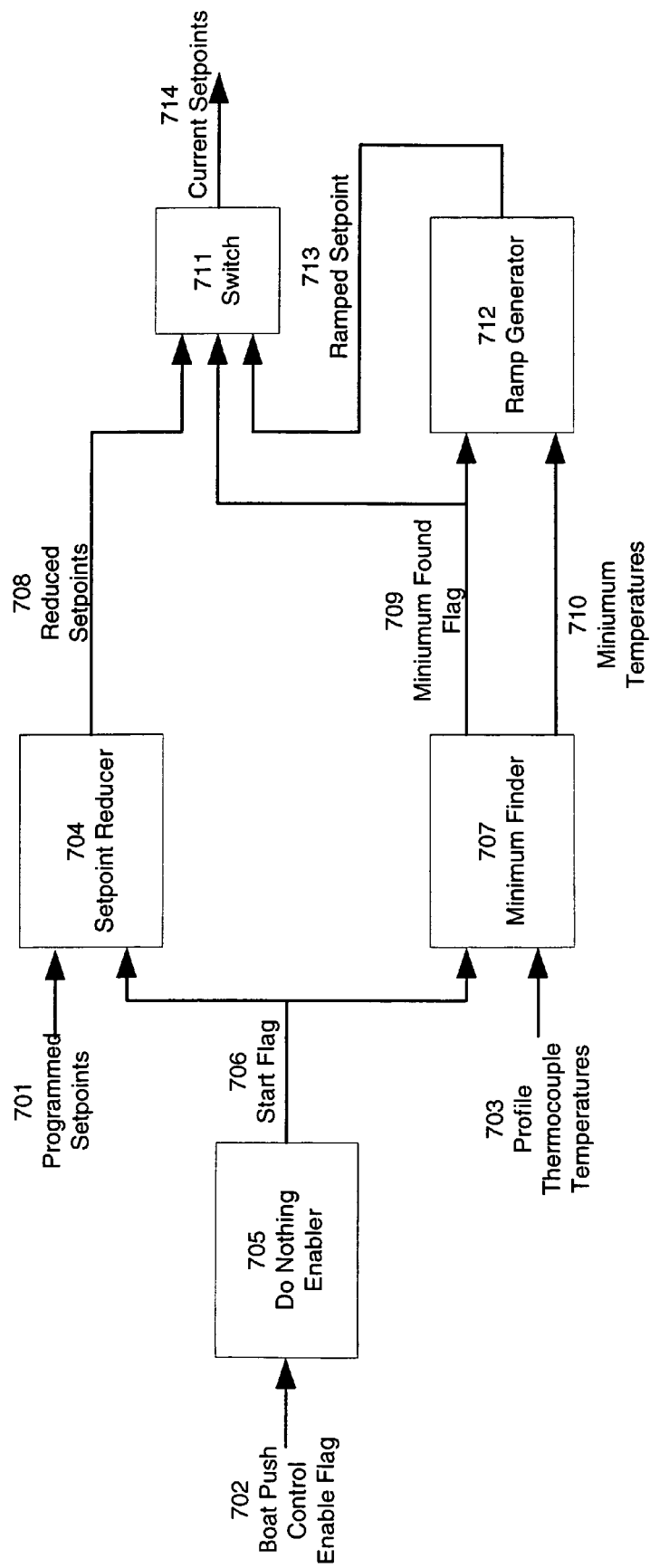
FIG. 7 is a block diagram of illustrating one embodiment of a controller incorporating features of the present invention.

Referring to FIG. 7, one embodiment of an architecture to implement a boat push control mode incorporating features of the present invention in a control system 700 for a thermal reactor 10 of FIG. 2 is illustrated. The architecture of system 700 generally includes profile temperature inputs 703, setpoint inputs 701, and an enable flag 702 to signal the beginning of a boat push. The outputs 714 from the system 700 are the altered setpoints for the temperature control system illustrated in FIG. 1. The "Do Nothing Enabler" 705 generates the start flag for the system after a programmed amount of time has expired after the Enable flag has been turned on. Once the start flag 706 has been set to, for example, a logical 1 the Setpoint Reducer 704 reduces the current setpoints 714 and the minimum finder 707 finds the minimum temperature 710. Once the minimum finder has found the minimum it sets the minimum found flag 709 to a logical 1. This begins the ramp generator 712 to ramp back to the original setpoint. The switch 711 switches between the reduced setpoint 708 and the ramped setpoint 713 when the minimum found flag 709 has been set to a logical 1.

The system 700 can include for example, nine parameters that can be used to "tune" the Boat Push Control Mode, although any suitable number and type of parameters can be used.

These parameters can include, for example:

1. Post Minimum wait time (seconds)—This is the amount of time (in seconds) that the temperature has been above the minimum before it has been declared a minimum.

2. Ramp Rate (° C./minute)—How fast the temperature is ramped back up to the setpoint after the "minimum" has been found.

3. Do Nothing Time (seconds)—After the mode has been triggered this is how long the mode waits before it reduces the setpoints.

4. Reduce Setpoints (° C.)—The number of degrees by which the temperature setpoint is reduced after the Do Nothing Time. The setpoints will remain here until the temperatures have found their minimum (see number 5). Then they will begin to ramp.

5. Ramping Flag
   a. 0=Independent Ramping—Use this ramping mode if the zones seem to react independent of each other.
   b. 1=OR Ramping
   c. 2=AND Ramping—This ramping mode is good when zones are coupled between each other.
   d. 3=Single Reference—This ramping mode also is good when zone are coupled and when there is a problem with zones separation.

6. Degrees below setpoint to begin smoothing (° C.)

7. Smoothing Pole—See section on Smoothing

8. Smooth Time—See section on Smoothing

9. Offset—See section on Smoothing

Exemplary simulation of how the above parameters can change are illustrated in the graphs of FIGS. 8–11.

Figure 8:
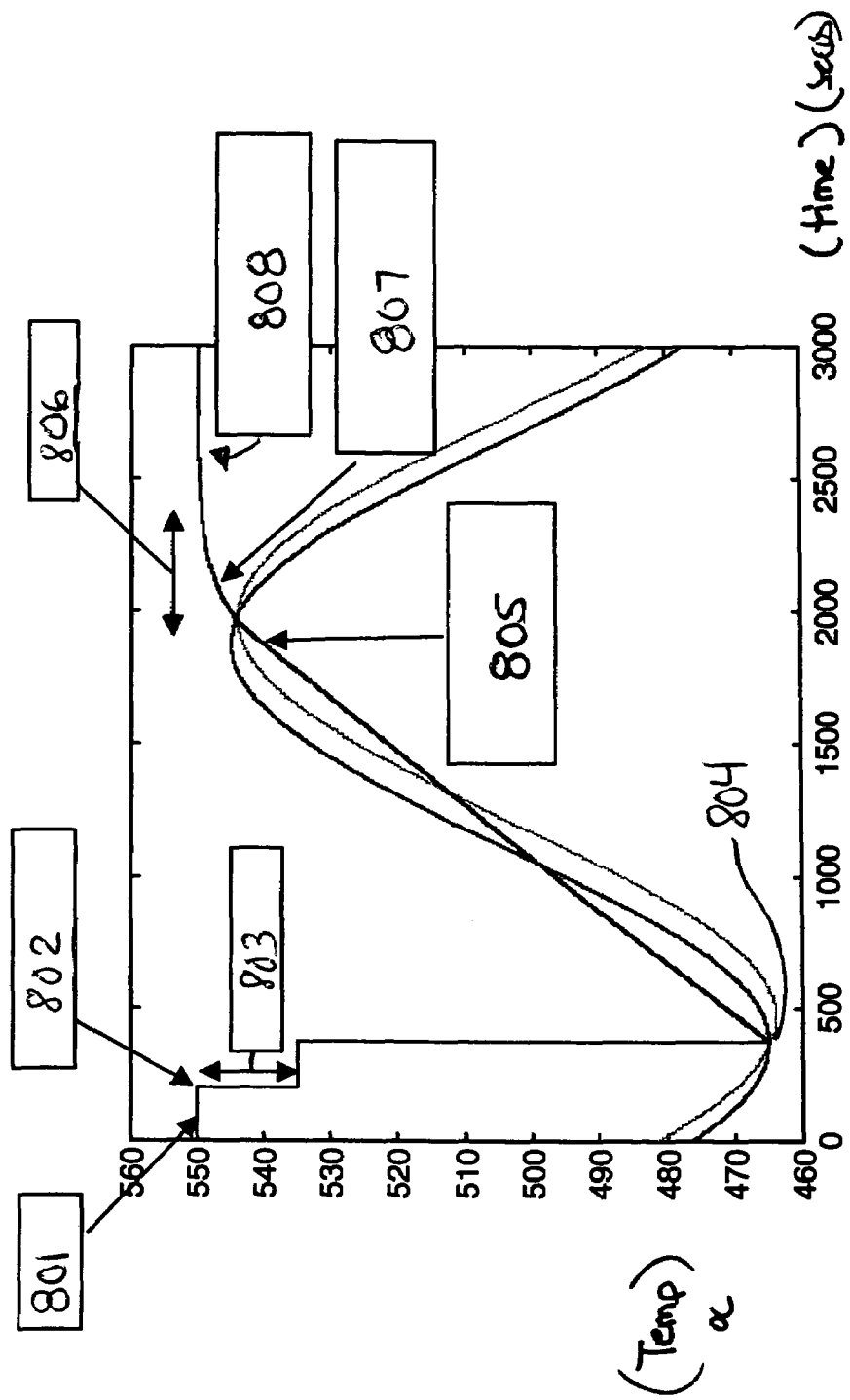
FIG. 8 is a graph illustrating one embodiment of a modified ramp function that may be applied to the input of one embodiment of a controller of a temperature control system incorporating features of the present invention to limit temperature overshoot during a ramp-up temperature phase.

FIG. 8 is an example of OR ramping. In FIG. 8, the boat push control mode is enabled at a reference point 801 and the "Do Nothing" mode is enabled. At reference point 802 the Do Nothing mode expires and the Reduce Setpoints mode at reference point 803 is enabled. At reference point 804 the minimum has been found and the temperature setpoints have begun ramping back to the original setpoint. At reference point 805, the boat push control mode begins smoothing. In this particular example, the smoothing mode was set to begin at approximately 10° below the original setpoint.

The smooth time is represented by reference point 806. As shown at reference point 807, the larger the pole gets the faster the setpoint is ramped back to the original setpoint. The offset at reference point 808 is aimed for overshoot on the setpoint.

Figure 9:
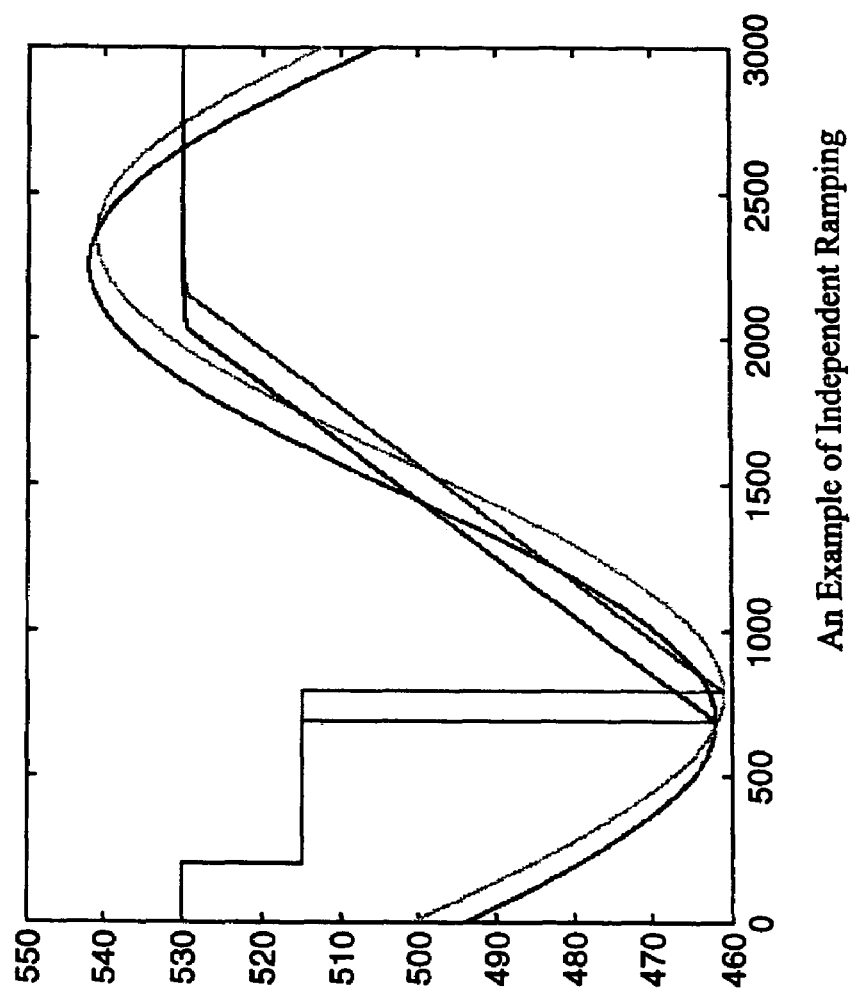
FIG. 9 is a graph illustrating a further embodiment of a modified or independent ramp function that may be applied to the input of one embodiment of a controller of a temperature control system incorporating features of the present invention to limit temperature overshoot during a ramp-up temperature phase.

FIG. 9 is an example of independent ramping showing how the temperature setpoints for each of the zones are ramped independent of what the other zones are doing.

Figure 10:
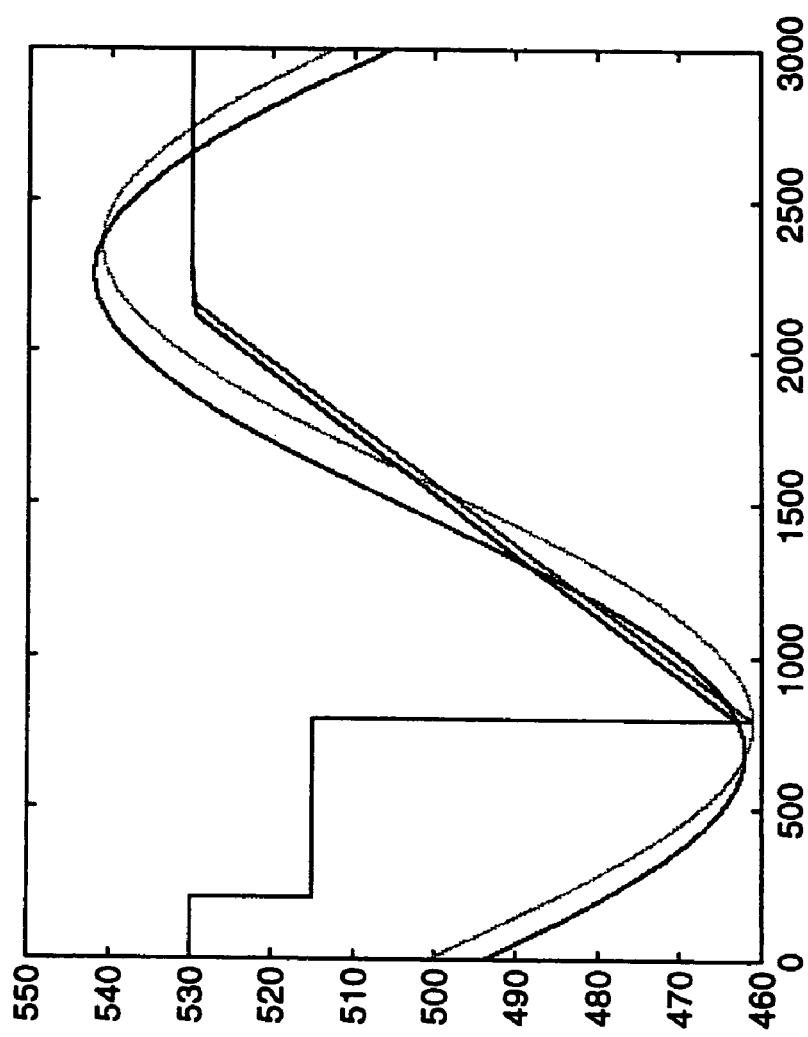
FIG. 10 is a graph illustrating one embodiment of a modified (AND) ramp function that may be applied to the input of one embodiment of a controller of a temperature control system incorporating features of the present invention to limit temperature overshoot during a ramp-up temperature phase.

FIG. 10 is an example of AND ramping where each temperature setpoint for each zone is ramped from its own minimum but ramping waits until all zones have found their minimum.

Figure 11:
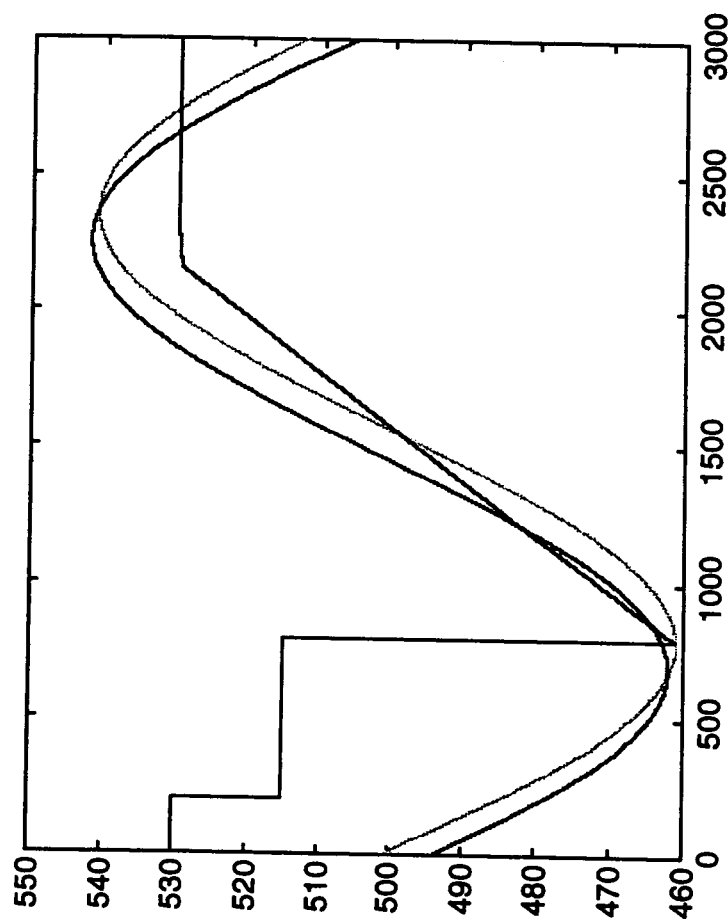
FIG. 11 is a graph illustrating another (single reference) embodiment of a modified ramp function that may be applied to an input of one embodiment of a controller incorporating features of the present invention of a temperature control system incorporating features of the present invention to limit temperature overshoot during a ramp-up temperature phase.

FIG. 11 is an example of single reference ramping where all zones use the same temperature setpoint and a single minimum is found for all zones.

The present invention generally uses input data, such as reference temperature (setpoints), profile temperatures and spike temperatures to eliminate temperature controller saturation and minimize overshoots. Other input data could include user defined data, boat speed and boat position data. The present invention controls the temperature overshoot by monitoring and limiting the temperature controller input error during the boat push.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method of minimizing thermal reactor temperature overshoot and stabilization time during a boat push comprising the steps of:
   reducing current temperature setpoints of each zone in the reactor to a minimum temperature value;
   monitoring each zone for the minimum temperature value; and
   as the temperature in the reactor begins to increase during the boat push, ramping the reduced current temperature setpoints back to an original temperature setpoint.

2. The method of claim 1 wherein the step of reducing current temperature setpoints minimizes temperature overshoots in the reactor caused by an addition of heat due to an introduction of a load of wafers into a processing chamber.

3. The method of claim 1 wherein the step of ramping comprises ramping the reactor from the reduced current temperature setpoints to the original setpoint, wherein during the ramping powers of all heating zones of the reactor are not in saturation.

4. The method of claim 1 wherein an observed minimum temperature is not declared the minimum temperature value until a period of time elapses where actual temperature values are above an observed minimum temperature.

5. The method of claim 1 further comprising a time delay after initiating the boat push mode before reducing the temperature setpoint minimum value in order to allow enough time to elapse before the introduction of the wafer load effects the temperature in the processing chamber.

6. The method of claim 1 wherein prior to reaching the minimum value, a setpoint temperature is reduced by an amount that equals a value of a largest temperature overshoot.

7. The method of claim 1 further comprising the step of selecting a ramping mode to be used to ramp the temperature back to the original setpoint.

8. The method of claim 1 further comprising ramping a temperature of a respective zone in the reactor back to the original setpoint of the zone after the zone finds its own minimum.

9. The method of claim 1 further comprising ramping the temperature back to the original setpoint after any zone in the reactor finds minimum.

10. The method of claim 1 further comprising ramping the temperature of each zone in the reactor back to the original setpoint only after all zones in the reactor have reached a minimum.

11. The method of claim 1 further comprising ramping all zones of the reactor back to the original setpoint from a minimum value of minimum values reached for all zones of the reactor.

12. The method of claim 1 wherein the step of reducing a temperature setpoint to a minimum value comprises looking for a minimum temperature in each zone of the reactor after initiating the boat push.

13. A method for controlling temperature overshoot during a boat push in a thermal reactor comprising:

activating a boat push control mode;

waiting a predetermined period of time;

reducing current setpoints for each zone;

monitoring each zone of the thermal reactor to determine a minimum temperature for each zone;

ramping the reduced current setpoints back to an original setpoint.

14. The method of claim 13 wherein the step of ramping comprises implementing independent ramping wherein each zone independently ramps to a current setpoint for the zone after each respective zone finds its minimum.

15. The method of claim 13 wherein the step of ramping comprises multiple reference ramping wherein all of the zones ramp up to their original setpoint only when all the zones have found their minimum.

16. The method of claim 13 wherein the step of ramping comprises single reference ramping wherein all of the zones ramp up to their original setpoint only after a minimum of all of the minimums for each zone is reached.

17. The method of claim 13 further comprising enabling a smoothing mode at a predetermined temperature level prior to reaching the original setpoint in order to reduce temperature overshoot at the original setpoint.

* * * * *